(12) United States Patent
Stirling et al.

(10) Patent No.: US 8,219,782 B2
(45) Date of Patent: Jul. 10, 2012

(54) ADDRESS GENERATION

(75) Inventors: Colin Stirling, Edinburgh (GB); David I. Lawrie, Lauder (GB); David Andrews, Falkirk (GB)

(73) Assignee: Xilinx, Inc., San Jose, CA (US)

( * ) Notice: Subject to any disclaimer, the term of this patent is extended or adjusted under 35 U.S.C. 154(b) by 777 days.

(21) Appl. No.: 12/233,320

(22) Filed: Sep. 18, 2008

(65) Prior Publication Data
US 2010/0070737 A1    Mar. 18, 2010

(51) Int. Cl.
*G06F 12/06* (2006.01)

(52) U.S. Cl. ............................................ 711/217; 708/8

(58) Field of Classification Search .................. 711/217
See application file for complete search history.

(56) References Cited

U.S. PATENT DOCUMENTS

| | | | | |
|---|---|---|---|---|
| 3,883,852 A * | 5/1975 | Cotter | | 341/13 |
| 4,649,419 A * | 3/1987 | Arragon et al. | | 380/215 |
| 5,282,275 A * | 1/1994 | Andre et al. | | 711/220 |
| 5,687,342 A * | 11/1997 | Kass | | 711/201 |
| 5,726,925 A * | 3/1998 | Hyun et al. | | 708/410 |
| 5,765,218 A * | 6/1998 | Ozawa et al. | | 711/219 |
| 5,905,665 A * | 5/1999 | Rim | | 708/491 |
| 6,321,311 B1 * | 11/2001 | Kim | | 711/157 |
| 6,590,951 B1 * | 7/2003 | Kim et al. | | 375/377 |
| 6,668,350 B1 * | 12/2003 | Kim | | 714/759 |
| 6,865,660 B2 * | 3/2005 | Duncan | | 711/217 |
| 6,871,303 B2 * | 3/2005 | Halter | | 714/702 |
| 7,262,716 B2 * | 8/2007 | Yu et al. | | 341/61 |
| 7,302,620 B2 * | 11/2007 | Kim | | 714/701 |
| 7,437,657 B2 * | 10/2008 | Garrett | | 714/792 |
| 7,502,909 B2 * | 3/2009 | Moat et al. | | 711/217 |
| 2002/0087923 A1 * | 7/2002 | Eroz et al. | | 714/702 |
| 2002/0091900 A1 * | 7/2002 | Han | | 711/127 |
| 2003/0079106 A1 * | 4/2003 | Yasuda | | 711/220 |
| 2003/0105491 A1 * | 6/2003 | Ostler et al. | | 711/110 |
| 2003/0221084 A1 * | 11/2003 | Zhou | | 711/209 |
| 2004/0064666 A1 * | 4/2004 | Bickerstaff | | 711/200 |
| 2005/0044119 A1 * | 2/2005 | Langin-Hooper et al. | | 708/250 |

(Continued)

FOREIGN PATENT DOCUMENTS
EP    0 047 842 A2    3/1982

OTHER PUBLICATIONS

Jonghoon Ryu; Takeshita, O.Y.; , "On quadratic inverses for quadratic permutation polynomials over integer rings," Information Theory, IEEE Transactions on , vol. 52, No. 3, pp. 1254-1260, Mar. 2006.*

(Continued)

*Primary Examiner* — Sheng-Jen Tsai
*Assistant Examiner* — Ramon A Mercado
(74) *Attorney, Agent, or Firm* — W. Eric Webostad; John J. King

(57) ABSTRACT

Address generation by an integrated circuit is described. An aspect relates generally to an address generator which has first and second processing units. The second processing unit is coupled to receive a stage output from the first processing unit and configured to provide an address output. The stage output is in a first range, and the address output is in a second range. The first range is from $-K$ to $-1$ for K a block size, and the second range is from 0 to $K-1$.

19 Claims, 5 Drawing Sheets

U.S. PATENT DOCUMENTS

| | | | |
|---|---|---|---|
| 2006/0047735 A1* | 3/2006 | Nunes | 708/250 |
| 2007/0174585 A1* | 7/2007 | Matthey | 711/217 |
| 2009/0292898 A1* | 11/2009 | Persson et al. | 711/200 |
| 2010/0191932 A1* | 7/2010 | Kim et al. | 711/217 |

OTHER PUBLICATIONS

Yang Sun; Yuming Zhu; Goel, M.; Cavallaro, J.R.;, "Configurable and scalable high throughput turbo decoder architecture for multiple 4G wireless standards," Application-Specific Systems, Architectures and Processors, 2008. ASAP 2008. International Conference on, vol., No., pp. 209-214, Jul. 2-4, 2008.*

Ryu, Johnhoon, et al., *On Quadratic Inverses for Quadratic Permutation Polynomials Over Integer Rings*, Information Theory, IEEE Transactions on, Mar. 2006, pp. 1254-1260, vol. 52, No. 3.

Sun, Yang et al., "Configurable and Scalable High Throughput Turbo Decoder Architecture for Multiple 4G Wireless Standards", Application-Specific Systems, Architectures and Processors, 2008 ASAP 2008, International Conference on, IEEE, Piscataway, NJ, Jul. 7, 2002, pp. 209-214.

Ericsson, "Quadratic Permutation Polynomial Interleavers for LTE Turbo Coding", 3GPP Draft; R-1-063137, $3^{rd}$ Generation Partnership Project (3GPP), Mobile Competence Centre, 650, Route Des Lucioles; F-06921 Sophia-Antipolis Cedex; France, vol. Ran WG1, No. Riga, Latvia, Nov. 1, 2006, 5 pages.

3GPP TS 36.212 V 8.3.0 Technical Specification Group Radio Access Network, Evolved Universal Terrestrial Radio Access (E-UTRA), Multiplexing and channel coding, Release 8, May 2008, 48 pages, http://www.3gpp.org.

U.S. Appl. No. 12/059,731, filed Mar. 31, 2008, Jones, Ben J. etal., Xilinx, Inc. 2100 Logic Drive, San Jose, Ca 95124.

3GPP LTE Turbo Encoder v2.0, DS701, Xilinx, Inc. 2100 Logic Drive, San Jose, Ca 95124, Sep. 19, 2008, 11 pages.

3GPP, "Quadratic Permutation Polynomial Interleaver Designs for LTE Turbo," Jan. 9, 2007, 3GPP TSG-RAN WG1 #47bis, R1-070462.

* cited by examiner

```
Set Block Size K; Skip Value n                    ← 503
A_cand[0] = ∏(0) = (f₁x + f₂x²) mod K = 0         ← 203-2 (even)
I_cand[0] = ∏'(0) = [f₂(2nx + n²) + f₁n] mod K = [4f₂ + 2f₁] mod K   ← 203-1 (even)
A_cand[1] = ∏(1) = (f₁x + f₂x²) mod K = (f₁ + f₂) mod K             ← 203-2 (odd)
I_cand[1] = ∏'(1) = [f₂(2nx + n²) + f₁n] mod K = [8f₂ + 2f₁] mod K  ← 203-1 (odd)
S = ∏''(x) = [2n²f₂] mod K = [4f₂] mod K          ← 204
```
(501 brackets the above)

```
for i := 0 to K-1 loop    ← 511 if A_cand[i mod 2] < 0 then
    A[i mod 2] = A_cand[i mod 2] + K              ← 512
  end if If I_cand[i mod 2] >= 0 then
    IminK[i mod 2] = I_cand[i mod 2] - K          ← 513
  end if A_cand[i mod 2] = A[i mod 2] + IminK[i mod 2]   ← 514

I_cand[i mod 2] = IminK[i mod 2] + S            ← 515

Addr[i] = A[i mod 2]                            ← 516 end loop    ← 517
```
(502 brackets the above)

FIG. 5

ADDRESS GENERATION

FIELD OF THE INVENTION

The invention relates to integrated circuit devices ("ICs"). More particularly, the invention relates to address generation by an IC.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Turbo-channel codes conventionally are used to code data. Turbo codes use data in the order in which it is received and in an interleaved order. Original data is therefore used twice. By turbo-channel codes, it is meant convolutional codes. The data is shuffled using an interleaver, and such interleaver may be part of an encoder, a decoder, or an encoder/decoder ("codec").

Data may be interleaved prior to encoding and then deinterleaved for decoding. In some coding, including either or both encoding and decoding, systems, have high throughputs achieved through parallel processing. Data is generally interleaved by an encoder and deinterleaved by a decoder. Because decoding is more computationally intensive than encoding, and in order to achieve overall system high throughput, deinterleaving should be capable of being implemented in parallel in the decoder.

In the $3^{rd}$ Generation Partnership Project ("3GPP"), a quadratic permutation polynomial ("QPP") interleaver is called out in the proposed Long Term Evolution ("LTE") 3GPP specification to facilitate contention-free addressing. Additional details regarding 3GPP LTE may be found at http://www.3gpp.org. In particular, the 3GPP TS 36.212 version 8.3.0 Technical Specification dated May 2008 discloses channel coding, multiplexing, and interleaving in section 5 thereof, particularly sub-sections 5.1.3, 5.1.4.1.1, and 5.2.2.8 describing a channel interleaver.

Using a QPP interleaver allows individual blocks of data to be split into multiple threads and processed in parallel. If multiple independent blocks of data each have their threads processed, then processing such threads of all such data blocks in parallel involves replicating the QPP interleaver. Accordingly, it should be appreciated that the size and performance of an interleaver circuit used to implement a QPP interleaver affects both efficiency of encoding and decoding turbo-channel codes.

SUMMARY OF THE INVENTION

One or more embodiments of the present invention generally relate to address generation by an integrated circuit. One aspect of various embodiments relates generally to an address generator which has first and second processing units. The second processing unit is coupled to receive a stage output from the first processing unit and configured to provide an address output. The stage output is in a first range, and the address output is in a second range. The first range is from $-K$ to $-1$ for K a block size, and the second range is from 0 to $K-1$.

Another aspect relates generally to an address generator which has a first stage address engine and a second stage address engine coupled to receive a stage output from the first stage address engine and configured to provide an address output. The first stage address engine is configured to move intermediate positive values by a block size in a negative direction. The second stage address engine is configured to move intermediate negative values by the block size in a positive direction.

Yet another aspect relates generally to a method for generating addresses. A step size, a block size, a first initialization value, and a second initialization value are obtained. The step size is added to a difference to provide a sum. Either a null value or the block size is subtracted from the sum responsive to a sign bit of the sum to provide another instance of the difference, where the difference is in a range of $-K$ to $-1$ for K the block size. At least one of the sum and the difference is registered, and the difference is fed back for another iteration of the addition. The adding, subtracting, registering, and feeding back is repeated for a sequence.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 5 is a pseudo-code listing depicting an exemplary embodiment of an address generation flow.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
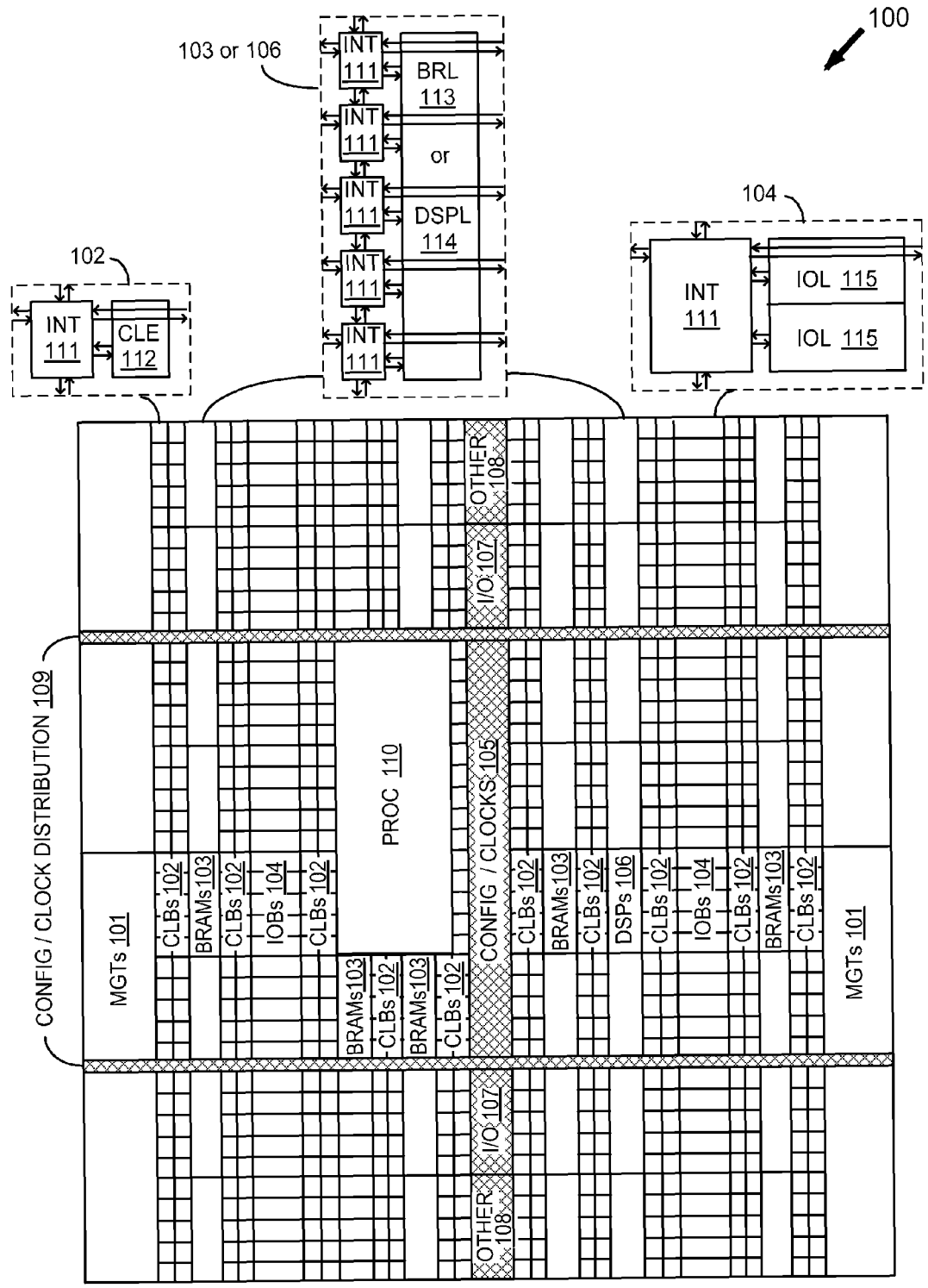
FIG. 1 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a columnar area near the center of the die (shown in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

As previously described, a QPP interleaver is specified in an LTE 3GPP specification, and such QPP interleaver may be formulated as quadratic equation modulo the block size, K. A direct implementation of the specified QPP interleaving process would involve complex multiplication and complex modulo operations, which are extremely inefficient for implementation in hardware. A more efficient hardware implementation is described in co-pending U.S. Patent Application entitled "Address Generation for Quadratic Permutation Polynomial Interleaving" by Ben J. Jones et al, assigned application Ser. No. 12/059,731, filed Mar. 31, 2008 [hereinafter "Jones"]. Jones shows and describes how the quadratic formula may be reduced to produce a circuit which may be implemented using adders, subtractors, and selection circuits, such as multiplexers. As described below in additional detail, an even further simplified circuit for address generation for interleaving may be obtained by removing selection operations associated with Jones and reducing the number of adders and subtractors of Jones. Furthermore, such reduction of circuitry in turn reduces register count in comparison to Jones, but as shall be appreciated from the following description such simplified address generator has same or comparable performance to that of Jones. Another reduction in comparison to Jones is elimination of registers between first and second stages allowing control logic to be further simplified as initialization values may be applied simultaneously as described below in additional detail.

Even though the following description is in terms of an LTE 3GPP QPP interleaver and address sequence therefor, it should be appreciated that other address sequences may be used. An LTE 3GPP QPP interleaver has an address sequence as defined by:

$$\pi(x)=(f_1 x+f_2 x^2) \bmod K, \text{ where } 0 \leq x, f_1, f_2 < K, \qquad (1)$$

where $f_1$ and $f_2$ are coefficients of the polynomial, x is an increment in a linear sequence from 0 to K−1, and K is block size. An x-th interleaved address may be obtained by using Equation (1), where $f_1$, and $f_2$ are fixed coefficients for any integer block size, K. Accordingly, the sequence of addresses for increments of x are from 0 to K−1 in a permutated order for x. It should be understood that even though a sequence is described as going from 0 to K−1, it should be appreciated that a sequence need not start at 0 and need not go all the way to K−1, namely it need not step through each linear increment of the sequence for all K increments. Furthermore, there may be skip value for skipping linear increments for generating a sequence. Again, it should be appreciated that a block of data may be broken out into multiple threads or streams for processing in parallel as described below in additional detail.

As indicated in Jones, a first derivation of Equation (1) is:

$$\pi'(x)=[f_2(2nx+n^2)+f_1 n] \mod K, \quad (2)$$

and a second derivation of Equation (1) is:

$$\pi''(x)=[2n^2 f_2] \mod K. \quad (3)$$

In Equations (2) and (3), n is a skip value which may be any integer value greater than 0. Thus, for example, if n is equal to 1, there is no skipping and each linear increment of a sequence, 0, 1, 2, . . . , to some number which may be as large as K−1, is processed in order to provide at most K interleaved addresses for such sequence. Thus, the skip value, n, may be used to determine the stride or jump in an interleaved address sequence generated.

Again, when n is set to 1, a complete sequence of K addresses may be generated; however, if n is set to an integer value larger than 1 then a subset of addresses of a sequence may be generated. For example, if n is set equal to 2, then every other address in a sequence may be generated starting from 0, namely 0, 2, 4, . . . , K−2. Because the difference between successive terms in Equations (2) and (3) is a linear function and a constant, respectively, the circuit may be implemented using only add, subtract, and select operations, as described below in additional detail, for generating addresses of a sequence. Additionally, for purposes of pipelining multiple sequences, namely multiple threads or streams, where multiple streams are processed with one another, temporary storing operations, such as registering operations, may be added. Thus, as should be appreciated from the following description, multiple phases or sequences may be pipelined in a circuit implementation of an address generator to enhance throughput for generating interleaved addresses. Alternatively, depending on the parallel nature of turbo-code processing blocks, pipelining may be used to generate interleaved address sequences for different threads of a single or multiple blocks of data in an alternating manner. Thus it should be appreciated that many different sequence start points, namely many different starting points for x, and/or skip values, n, may be supported for a variety of data blocks. Initialization values may be predetermined and stored in memory for initialization of address generation for a sequence.

Figure 2:
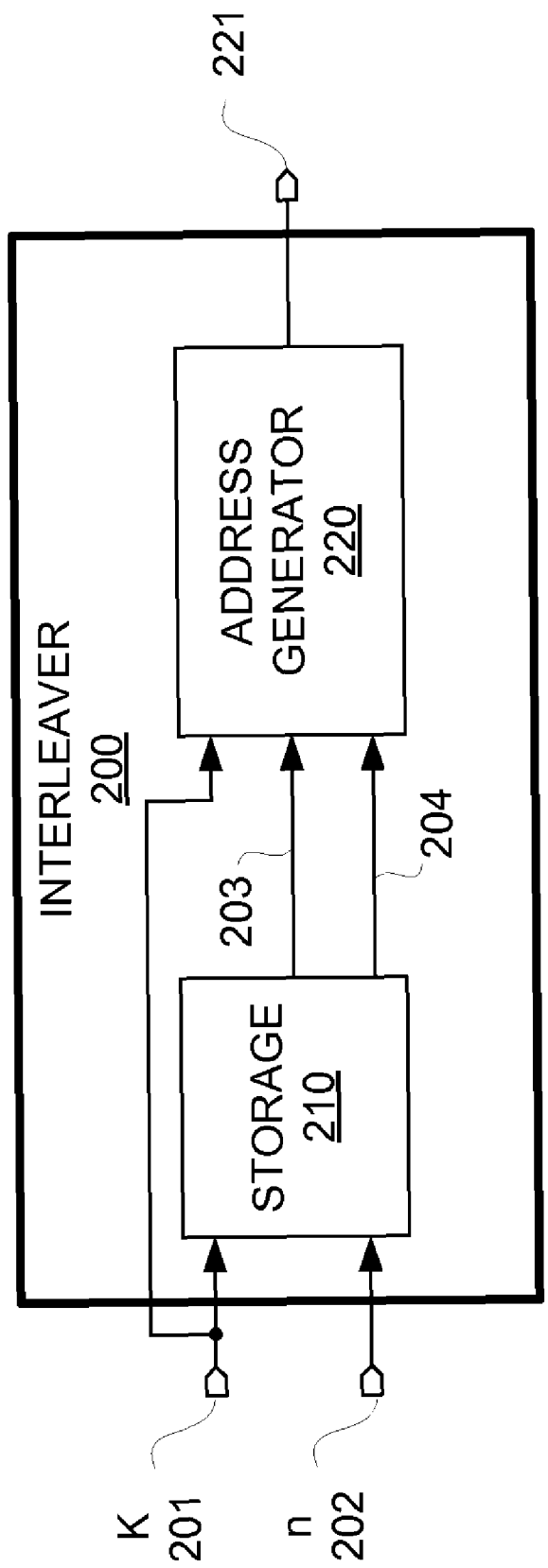
FIG. 2 is a block diagram depicting an exemplary embodiment of an interleaver.

FIG. 2 is a block diagram depicting an exemplary embodiment of an interleaver 200. Interleaver 200 may be part of a decoder, an encoder, or a codec. More particularly, interleaver 200 may be associated with convolutional codes, such as turbo-channel codes for QPP interleaving. Block size 201 may be input to storage 210, which may be part of or separate from interleaver 200. Storage 210 may be a look-up table, a random access memory, or other form of storage. Additionally, block size 201 may be input to address generator 220. Another input to storage 210 may be skip value 202. With block size 201 and skip value 202, initialization values 203 and step size 204 may be obtained from storage 210 for providing to address generator 220. Address generator 220 produces addresses 221 to provide one or more sequences of addresses.

Figure 3:
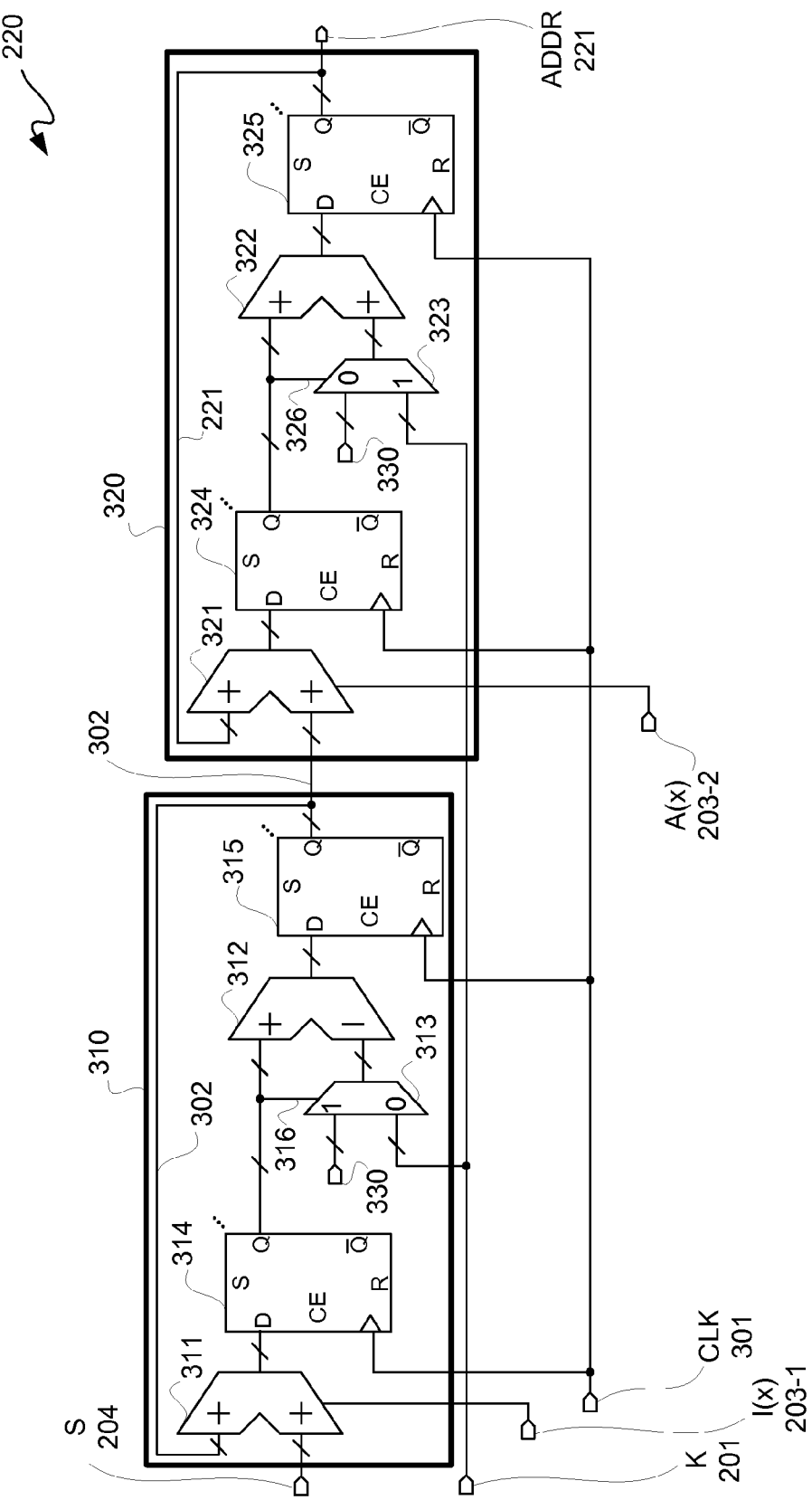
FIG. 3 is a circuit diagram depicting an exemplary embodiment of an address generator of the interleaver of FIG. 2.

FIG. 3 is a circuit diagram depicting an embodiment of address generator 220 of FIG. 2. Address generator 220 includes a first stage address engine 310 and a second stage address engine 320. First stage address engine 310 is an initial stage for address generation and generates a stage output 302. Stage output 302 is provided to second stage address engine 320 for generating at least one sequence of addresses 221.

First stage address engine 310 includes adder 311, subtractor 312, and a select circuit, such as multiplexer 313. For this exemplary embodiment, first stage address engine 310 includes registers 314 and 315. For a single stream/sequence, only one of register, namely either register 314 or 315, may be implemented within the feedback loop of first stage address engine 310. The setup of registers in first stage engine 310 mirrors that of second stage engine 320 to ensure that the values for a particular stream/sequence are coincident at the input to adder 321 from stage output 302 at the same point in time for iterations. However, pipelining may be used to enhance throughput. Additionally, by having at least one each of registers 314 and 315, two sequences of addresses, namely two threads or streams, may be generated together. Furthermore, even though only one of each of registers 314 and 315 is illustratively shown, it should be appreciated that more than one of each of registers 314 and 315 may be implemented. For example, if there were two of each of registers 314 and 315, then as many as four threads or streams of sequences may be generated with pipelined concurrency. It should be understood that streams are generated on alternate clock cycles. Furthermore, edge triggered flip-flops may be used to generate streams on alternate edges. For purposes of clarity by way of example and not limitation, it shall be assumed that there is only one each of registers 314 and 315.

As previously described, initialization values 203 may be obtained from storage 210. These initialization values are indicated as initialization value I(x) 203-1 and initialization value A(x) 203-2.

Second stage address engine 320 includes adder 321, adder 322, and select circuitry, such as multiplexer 323. Additionally, if pipelining is used, second stage address engine 320 may include at least one register 324 and at least one register 325. Again, there may be at least one of registers 324 and 325 or multiples of each of registers 324 and 325 as previously described with reference to registers 314 and 315. Again, however, for purposes of clarity by way of example and not limitation, it shall be assumed that there is one each of registers 324 and 325. At this point, it should be understood that address engines 310 and 320 may be implemented with three adders, one subtractor, and two select circuits.

Initialization value I(x) 203-1 is provided as a loadable input to loadable adder 311. On an initial clock cycle of clock signal 301, which is provided to a clock portion of each of registers 314, 315, 324, and 325, output of adder 311 uses initialization value I(x) 203-1 as its initial valid output for a sequence. Likewise, for an initial cycle of a sequence, initialization value A(x) 203-2, which is provided as a loadable input to loadable adder 321, is used for an initial valid output therefrom.

A step size 204 is provided as a data input to adder 311. Another data input to adder 311 is stage output 302, which is provided as a feedback input. Accordingly, step size 204 may be added with initial stage output 302 for output after an initialization value I(x) 203-1 is output from such adder. More particularly, for the exemplary embodiment of FIG. 3, because registers 314 and 315 are present, a first initialization value applied at adder 311 is not fed back as feedback 302 to adder 311 until two clock cycles later when it should have step value 204 added to it (i.e., in the third cycle). On the second cycle, an additional initialization value may be applied for a second sequence/stream as supported when there are two registers/pipe-stages within the feedback loop.

Output of adder 311 is provided to a data input port of register 314. Output of register 314 is provided to a plus port of subtractor 312. Additionally, a sign bit, such as a most significant bit ("MSB") 316 is obtained from the output of register 314 as a control select signal of multiplexer 313. It should be appreciated that the MSB output from register 314 is also provided to the plus port of subtractor 312.

A logic 0 port of multiplexer 313 is coupled to receive block size 201, and a logic 1 port of multiplexer 313 is coupled to receive logic 0s 330. If MSB bit 316 is a logic 1 indicating a negative value, then multiplexer 313 outputs logic 0s 330, namely a null value. If, however, MSB bit 316 is a logic 0 indicating output of register 314 is a positive value, then multiplexer 313 outputs block size 201.

Output of multiplexer 313 is provided to a minus port of subtractor 312 for subtracting from the data input to a plus port thereof. Alternatively, multiplexer 313 and subtractor 312 in combination may be considered a loadable adder, where the value to be loaded is the candidate to be subtracted from (i.e., connected to plus input port) and the load control bit is the MSB of this value. Accordingly, it should be appreciated that if output from register 314 is positive, subtraction of block size 201, namely −K, forces output of subtractor 312 to be negative, namely in a range of −K to −1. If output of register 314 is already negative, adding logic 0 s 330 to such output has no affect, and thus output of subtractor 312 is the negative output of register 314. Accordingly, output of subtractor 312 is in a range of −K to −1 for input to a data port of register 315. Output of register 315 is stage output 302. Thus, stage output 302 will be in a range of −K to −1, for K being block size 201. Thus, first stage address engine 310 shifts the range to negative values, namely a move of −K.

Stage output 302 from first stage address engine 310 is provided to a data port of adder 321 for addition with an address 221. Address 221 is an address output from register 325 and provided as a feedback address. It should be appreciated that a sequence of addresses 221 is produced from multiple clock cycles during operation. On clock cycles where valid data is output from address generator 220, address 221 constitutes an address output forming part of address sequence.

After outputting an initial initialization value A(x) 203-2, loadable adder 321 may output the sum of a feedback address 221 and a stage output 302. On a next cycle, another initialization value for another sequence, as previously described with reference to loadable adder 311 and not repeated here for purposes of clarity. Output from loadable adder 321 is provided to a data port of register 324. Output of register 324 is provided to a data port of adder 322, and a sign bit, such as an MSB bit 326, output from register 324 is provided as a control select signal to multiplexer 323 as well as being provided to a data port of adder 322.

A logic 0 port of multiplexer 323 is coupled to receive logic 0 s 330, and a logic 1 port of multiplexer 323 is coupled to receive block size 201. For MSB bit 326 being a logic 0, namely indicating that output of register 324 is positive, multiplexer 323 selects logic 0 s 330 for output. If, however, MSB bit 326 is a logic 1 indicating that output of register 324 is a negative value, then multiplexer 323 selects block size 201 for output.

Output of multiplexer 323 is provided to a data input port of adder 322. Adder 322 adds the output from register 324 with the output from multiplexer 323. Accordingly, it should be appreciated that output of adder 322 is in a positive range, namely from 0 to K−1. In other words, by adding K back in address engine 320, the shift or move of values by −K in address engine 310 is effectively neutralized, namely has no net affect on the calculation.

Output of adder 322, which is in a range of 0 to K−1, is provided to data input port of register 325. Output of register 325 is an address 221, which is fed back to adder 321 and which is used as part of an address sequence.

First stage address engine 310 and second stage address engine 320 may be implemented with respective DSPs 106 and CLBs 102 of FPGA 100 of FIG. 1. Alternatively, only CLBs 102 may be used for implementing engines 310 and 320. By having an address engine stage implemented with one of each of a CLB and a DSP implementing multiple address engines operate in parallel is facilitated, as so few resources are consumed by each address engine stage. In other words, because so few circuit components may be used to provide address generator 220, there are more opportunities for implementing multiple address generators within an FPGA.

Figure 4:
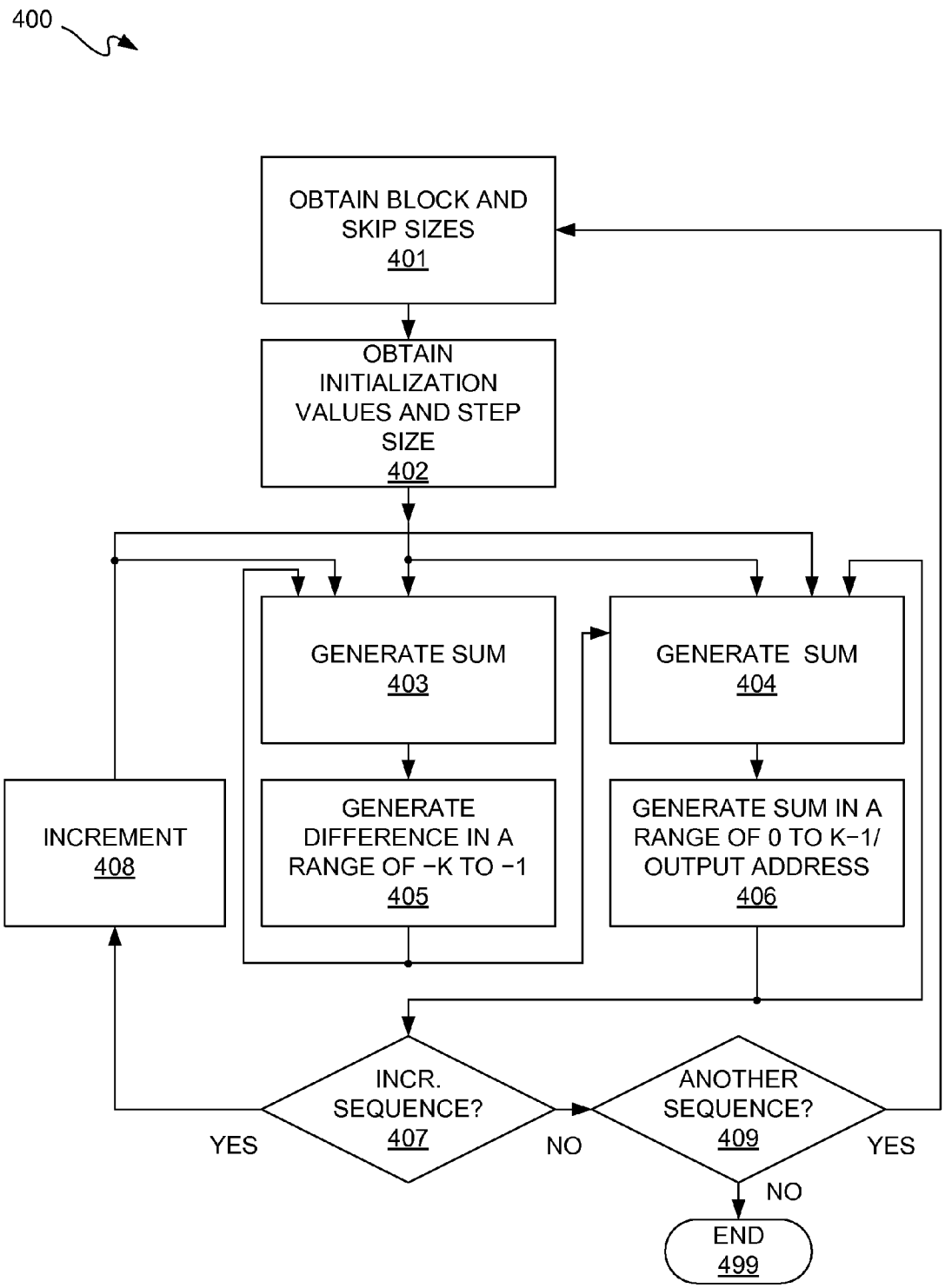
FIG. 4 is a flow diagram depicting an exemplary embodiment of an address generation flow of the address generator of FIG. 3.

In the exemplary embodiment of FIG. 3, address engines 310 and 320 are coupled in series and thus have a sequential operation. However, it should be understood that address engines 310 and 320 are operated concurrently for processing a sequence. Thus, for the exemplary embodiment having registers 314, 315, 324, and 325, rather than having a four cycle latency before a valid address 221, is output as part of an address sequence 321, there is only a two cycle latency. This is described in additional detail with reference to FIG. 4, where there is shown a flow diagram depicting an exemplary embodiment of an address generation flow 400 of address generator 220 of FIG. 3. Flow 400 is further described with simultaneous reference to FIGS. 3 and 4.

At 401, block and skip sizes, such as block size 201 and skip size 202, are obtained. At 402, initialization sizes, such as initialization values I(x) 203-1 and A(x) 203-2, and a step size, such as step size 204, are obtained from storage responsive to values obtained at 401.

At 403, a sum is generated, such as by adder 311, as previously described. At 404, a sum is generated by adder 321, as previously described. It should be appreciated that sums generated at 403 and 404 are generated concurrently, namely in parallel.

At 405, the sum generated at 403 is used in generating a difference, such as by subtractor 312. Again, this difference is in a range of −K to −1. The difference generated at 405 is provided for generating another sum at 404 on a next cycle.

At 406, a sum is generated, such as by adder 322, using the sum generated at 404. Again, generating of a difference at 405 and generating of a sum at 406 was previously described with reference to FIG. 3, and is not repeated here for purposes of clarity. Again, the range of the sum generated at 406 is from 0 to K−1. Furthermore, an address may be output at 406, such as address 221.

The address output at 406 is fed back to generate another sum at 404, in case the sequence is not completed. Moreover, the difference generated at 405 is fed back to generate another sum at 403, in case the sequence is not completed.

From output at 406, it may be determined whether the sequence is to be incremented at 407. For a hardware implementation, a counter (not shown) coupled to receive clock signal 301 may be preset for a linear sequence responsive to a step size 204 and/or a block size 201. However, for an implementation in software, including firmware, a decision may be made. If the sequence is to be incremented, then at 408 the sequence is incremented, namely x, or i as described below, is incremented, for generating other sums at 403 and 404 on a next clock cycle. Accordingly, the sequence of operations may be in hardware, software, or a combination thereof.

If at 407, it is determined that the sequence is not to be incremented, then at 409, it may be determined whether there is another sequence to be processed. If at 409 it is determined that another sequence is to be processed, then flow 400 returns to 401 for obtaining block and skip sizes for such other sequence. If there is no additional sequence to be processed, then flow 400 ends at 499.

FIG. 5 is a pseudo-code listing depicting an exemplary embodiment of an address generation flow 500. Values are set and initialized as generally indicated at 501 for loop 502.

For FIG. 5, it is assumed that block size K is equal to 256 for a turbo code and that skip value n is equal to two, namely two phases or two sequences being processed simultaneously, for setting block and skip sizes at 503. For this exemplary embodiment, the sequences are an odd sequence and an even sequence. For the even sequence, x starts at 0, and for the odd sequence x starts at 1. Accordingly, for the even sequence, initialization value ("A_cand[x]") 203-2(even) is Equation (1) with x equal to 0. Furthermore, for the even sequence, initialization value ("I_cand[x]") 203-1 (even) is Equation (2) with x set equal to 0. It should be appreciated that both initialization values 203-1 and 203-2 for an even sequence reduce to respective constants, as coefficients $f_1$ and $f_2$ are constants.

For an odd sequence, x starts at 1, and thus substituting x equal to 1 in Equation (1) yields an initialization value 203-2(odd), and substituting x equal to 1 in Equation (2) yields initialization value 203-1 (odd). Likewise, it should be appreciated that initialization values 203-1 and 203-2 for an odd sequence each reduce to constants.

Step size 204 is not dependent on x as indicated in Equation (3), and thus step size ("s") 204 is a constant value. By constant values with respect to initialization values 203-1 and 203-2 for odd and even sequences, as well as step size 204, it should be understood that these are constants for one or more sequences of a data block. In this example, there are two threads or streams, but more than two threads may be implemented. As x is incremented as part of a linear sequence, initialization address candidate ("A_cand[x]") and increment candidate ("I_cand[x]") progress for each increase in x. Thus for a first phase, namely an even sequence in this example, x is of the sequence 0, 2, 4, . . . , K−2, and for a second phase, x has a progression of 1, 3, 5, . . . , K−1, for this exemplary embodiment.

An address candidate is positive on a first iteration for a sequence, so it may be output directly. Furthermore, an increment candidate is positive on a first iteration for a sequence, so has a block size subtracted therefrom. Thus, for x equal to 0, the first address value output for the even sequence is initialization value 203-2(even), namely 0, and the initial stage output for such first iteration is initialization value 203-1 (even) minus K. By first iteration, it should be understood that there may be some cycle latency as previously described, and thus the first iteration means the first valid output. For the second iteration, namely the second valid output but the first for the odd sequence, the address candidate is positive and thus it may be output directly, namely without addition of K, and the increment candidate is positive on the second iteration, so it has the block size subtracted from it. Thus, on a second iteration, initialization value 203-2(odd) is output as address 221 of FIG. 3, and initialization value 203-1 (odd) minus K is output as stage output 302. Again, step size 204 is a constant which may be initialized as it depends only on skip value n for both odd and even phases. In other words, both odd and even phases have the same step sizes.

It is not necessary that skip value be set for n equal to 2. In other words larger skip values may be used or skip value n may be set equal to 1. Furthermore, even though a block size of K equal to 256 is described for purposes of clarity by way of example and not limitation, it should be understood that block sizes greater than or less than 256 may be used. Furthermore, even though a fixed block size is used for this example for purposes of clarity, it should be appreciated that a variable block size may be used. Thus, it is not necessary to use an odd and even sequence or even to alternate among multiple sequences using skip value. For example, skip value may be set to some fraction of the block size. It is not necessary for the linear sequence to progress all the way from 0 through to K−1, but some fraction of a sequence may be processed. However, for purposes of clarity by way of example and not limitation, it shall be assumed that the entire sequence from 0 to K−1 is processed in loop 502.

It is not necessary that x have initialization values corresponding to skip value. For example, x may be reinitialized at a fraction of the block size. Continuing the above example for K equal to 256, if x was to be initialized again at one half of K, then x equal to 128 would be substituted into Equations (1) and (2) for generating initialization values 203-2 and 203-1, respectively, for such processing. However, the first value, namely x equal to 0 in this sequence would be as previously described.

At 511, an increment i is set as going from 0 to K−1 for loop 502. If the address candidate is negative, then the block size K is added to the address candidate as indicated at 512. If the increment candidate is positive, then block size K is subtracted at indicated at 513.

At 514, the next address candidate for a then current phase is calculated. At 515, the next increment candidate for a then current phase is calculated. At 516, an address for the current phase is output. Loop 502 in this example is for i from 0 to K−1 in increments of one, and when i is equal to K−1 after 516, then loop 502 ends at 517.

Even though address generation flow 500 has been described for multiple threads or sequences, it should be understood that such flow may be reduced down for a single sequence, in which case only one set of address and increment candidates would be obtained. Furthermore, it should be understood that more than two sets of address and increment candidates may be incremented for more than two threads or phases.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. For example, initialization may take place before any register in each engine whereas the above description assumes initialization using the logic located in front of or just before an initial register of each engine. In other words, the exemplary embodiments just happen to show initialization in loadable adders 311 and 321 before registers 314 and 324, respectively, of FIG. 3. Initialization was assumed to be in adders 311 and 321 because these adders are less complex as they do not involve respective multiplexers. However, initialization may take place by at a loadable subtractor 312 and a loadable adder 322. Or both streams may be initialized at once rather than sequentially. So the difference from subtractor 312 and the sum from adder 322 may be initialized for a first sequence at the same time as the sum from adder 311 and the sum from adder 321 are initialized for a second sequence. Also when extra registers are inserted to allow for one or more extra streams, there may be no logic in front of such registers, and thus such registers may be used for initialization.

Furthermore, if a first stream/sequence used first and third initialization values and a second stream/sequence used second and fourth initialization values, it should be understood that such first and second streams/sequences may be completely independent of one another and each may be started at any point in a block though both may not have a same starting point. However, the first steam/sequence does not necessarily have to be initialized before or after the second stream/sequence. Furthermore, where the third initialization value corresponds to the same stream/sequence as the first initialization value, and where the third initialization value initializes the second processing engine, the first initialization value may be used to initialize the first processing engine for the same stream/sequence with a specific start location between 0 and K−1 (inclusive). Similarly, the second initialization value and the fourth initialization value may correspond to the same stream/sequence.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims and not by the above detailed description. It is noted that claims listing steps do not imply any order of the steps and that trademarks are the property of their respective owners.

What is claimed is:

1. An address generator, comprising:
a first processing unit coupled to a second processing unit, wherein the first processing unit is configured to generate a stage output and the second processing unit is configured to generate an address output;
the first processing unit comprising:
a first adder, the output of which is connected to a first input of a subtractor, the output of which is the stage output, and the stage output is fed back to the first adder, and either a null value or a block size K is selectively forwarded to a second input of the subtractor, and
wherein the stage output is in a first range from −K to −1 for a block size K; and
the second processing unit comprising:
a second adder, the output of which is connected to a first input of a third adder, the output of which is the address output, wherein the second processing unit receives the stage output from the first processing unit and generates the address output, and wherein the address output is fed back to the second adder, and either a null value or a block size K is selectively forwarded to a second input of the third adder, and wherein the address output is in a second range from 0 to K−1.

2. The address generator according to claim 1, wherein the address generator is part of a coding device selected from a group consisting of an encoder, a decoder, and a codec, the address generator for providing the address output for quadratic permutation polynomial interleaving.

3. The address generator according to claim 2, wherein the address output includes multiple address sequences.

4. The address generator according to claim 1, wherein the stage output is registered.

5. The address generator according to claim 3, wherein the first processing unit and the second processing unit are respectively initialized with at least a first initialization value and a second initialization value, and
wherein the first initialization value is for a first sequence of the multiple address sequences; and wherein the second initialization value is for a second sequence of the multiple address sequences.

6. The address generator according to claim 2, wherein:
the address output is for at least part of an address sequence from 0 to K−1;
the first processing unit is initialized with a first initialization value and a second initialization value; and
the second processing unit is initialized with a third initialization value and a fourth initialization value.

7. An address generator, comprising:
a first stage address engine generating a first stage output, wherein the first stage address engine includes:
a first adder coupled to receive a first stage initialization value, a step size input, and the stage output; the first adder configured to add the step size input with the stage output to provide a first sum; and
a subtractor coupled to the first adder for receiving on a port the first sum, and configured to provide the first stage output, wherein the first stage output is fed back to the first adder;
a second stage address engine coupled to receive the first stage output from the first stage address engine and configured to provide an address output,
wherein the second stage address engine includes:
a second adder coupled to receive a second stage initialization value, the stage output, and the address output, the second adder configured to add the stage output with the address output to provide a second sum; and
a third adder couple to receive the second sum, and configured to provide the address output, wherein the address output is fed back to the second adder;
the first stage address engine configured to move intermediate positive values by a block size in a negative direction; and
the second stage address engine configured to move intermediate negative values by the block size in a positive direction.

8. The address generator according to claim 7, wherein:
each of the first stage address engine and the second stage address engine are configured to determine whether intermediate values, including the intermediate positive values and the intermediate negative values, are either in a first range or a second range;
the first range is for values less than zero;
the second range is for values equal to or greater than zero;
the first stage address engine is configured to ensure the stage output is in the first range; and
the second stage address engine is configured to ensure the address output is in the second range.

9. The address generator according to claim 8, wherein:
the first range is from −K to −1 for the block size K; and
the second range is from 0 to K−1.

10. The address generator according to claim 9, wherein the first stage address engine further includes:
at least one register of a first register and a second register;

the first register if present coupled to receive the first sum from the first adder;

the subtractor further configured to receive either the first sum directly from the first adder or from the first register to the port thereof;

a first multiplexer coupled to receive the block size and a zero value as inputs and coupled to receive a sign bit of the first sum via either the first adder or the first register as a first control select;

the subtractor coupled to receive output from the first multiplexer to a minus port of the subtractor providing the stage output;

the second register, if present, coupled to receive output from the subtractor and configured to provide the stage output after registration; and the output from the subtractor is the first sum minus either the zero value for the negative intermediate values or the block size for the positive intermediate values of the first stage address engine.

11. The address generator according to claim 10, wherein the second stage address engine includes:

at least one other register of a third register and a fourth register;

the third register if present coupled to receive output from the second adder;

the third adder coupled either to the second adder or the third register for receiving the output from the second adder;

a second multiplexer coupled to receive the block size and the zero value as inputs and coupled to receive via either the second adder or the third register a bit from the output of the second adder as a second control select;

the third adder coupled to receive output from the second multiplexer;

the fourth register if present coupled to receive output from the third adder and configured to provide the address output after registration; and the output from the third adder is the second sum plus either the zero value for the positive intermediate values or the block size for the negative intermediate values of the second stage address engine.

12. The address generator according to claim 7, wherein:

the bit from the output of the first adder is a Most Significant Bit thereof; and the bit from the output of the second adder is a Most Significant Bit thereof.

13. The address generator according to claim 9, wherein the first stage address engine is operable to move intermediate positive values by a block size in a negative direction concurrently with the second stage address engine moving intermediate negative values by the block size in a positive direction.

14. The address generator according to claim 12, wherein the address generator is part of a quadratic permutation polynomial interleaver.

15. A method for generating addresses, comprising:

obtaining a step size and a block size K;

obtaining a first initialization value and a second initialization value;

adding the step size to a difference to generate a first sum, the first sum generated using a first adder circuitry;

generating a second instance of the difference by selectively subtracting either a null value or the block size K from the first sum, wherein the selection is responsive to a sign bit of the first sum, and the difference is generated by a substrator circuit, and wherein the difference is in a range of −K to −1 for the block size K;

registering at least one of the first sum and the difference;

feeding back the difference for another iteration of adding; and repeating the steps of adding, subtracting, registering, and feeding back to generate a first sequence;

second adding to provide a second sum by addition of the difference to a third sum;

third adding either the null value or the block size to the second sum responsive to a sign bit of the second sum to provide another instance of the third sum;

the third sum is in a range of 0 to K−1;

second registering at least one of the second sum and the third sum;

second feeding back the third sum for another iteration of the second adding; and second repeating the steps of second adding, third adding, second registering, and second feeding back for the first sequence.

16. The method according to claim 15, wherein the first registering and the second registering includes registration of each of the difference and the third sum within respective feedback loops for pipelined operation.

17. The method according to claim 15, wherein the first registering and the second registering includes registration of each of the first sum and the second sum within respective feedback loops for pipelined operation.

18. The method according to claim 15, further comprising: third obtaining a third initialization value and a fourth initialization value; and performing the steps of the first repeating and the second repeating for the first sequence and a second sequence for pipelining the first sequence and the second sequence together as separate sequences within a same pipeline.

19. The method according to claim 18, further comprising providing the third sum for quadratic permutation polynomial interleaving.

* * * * *